(12) United States Patent
Vashchenko et al.

(10) Patent No.: US 6,906,357 B1
(45) Date of Patent: Jun. 14, 2005

(54) ELECTROSTATIC DISCHARGE (ESD) PROTECTION STRUCTURE WITH SYMMETRICAL POSITIVE AND NEGATIVE ESD PROTECTION

(75) Inventors: Vladislav Vashchenko, Palo Alto, CA (US); Marcel ter Beek, Pleasanton, CA (US); Peter J. Hopper, San Jose, CA (US); Ann Concannon, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/683,625

(22) Filed: Oct. 10, 2003

(51) Int. Cl.[7] ................................. H01L 29/72
(52) U.S. Cl. ....................................... 257/173
(58) Field of Search ........................ 257/173

(56) References Cited

U.S. PATENT DOCUMENTS

| | | | |
|---|---|---|---|
| 6,016,002 A | * | 1/2000 | Chen et al. ............... 257/546 |
| 6,355,959 B1 | | 3/2002 | Vashchenko et al. |
| 6,433,368 B1 | | 8/2002 | Vashchenko et al. |
| 6,541,801 B1 | | 4/2003 | Vashchenko et al. |
| 2004/0217425 A1 | * | 11/2004 | Brodsky et al. ............ 257/360 |

* cited by examiner

*Primary Examiner*—Eddie Lee
*Assistant Examiner*—Douglas W. Owens
(74) *Attorney, Agent, or Firm*—Vedder Price Kaufman & Kammholz, P.C.

(57) ABSTRACT

An apparatus including an electrostatic discharge (ESD) protection structure with a diac in which substancially similar ESD protection is provided for both positive and negative ESD voltages appearing at the circuit electrode sought to be protected.

6 Claims, 2 Drawing Sheets

ELECTROSTATIC DISCHARGE (ESD) PROTECTION STRUCTURE WITH SYMMETRICAL POSITIVE AND NEGATIVE ESD PROTECTION

BACKGROUND OF THE INVENTION

1. Field of the Invention

The present invention relates to semiconductor circuit structures, and in particular, to semiconductor circuit structures providing electrostatic discharge (ESD) protection for integrated circuits.

2. Description of the Related Art

Electrostatic discharge (ESD) protection devices are widely used in an integrated circuit (IC) to protect the electronic devices within the IC, e.g., bipolar junction transistors (BJTs) and metal oxide semiconductor field effect transistors (MOSFETs), from spurious voltage pulses caused by various sources of electrostatic energy. Numerous conventional ESD protection structures and devices are well known in the art, and include the use of BJTs, MOSFETs, grounded gate metal oxide semiconductor (GGMOS) structures, low voltage triggered silicon controlled rectifiers (LVTSCRs), triacs and diacs.

Electrostatic discharge events produce voltages that typically have large magnitudes and can be either positive or negative in polarity (i.e., with respect to the reference, or ground, potential of the circuit to be protected). Most conventional ESD protection structures can only protect against ESD events of a single polarity. Accordingly, for protection against both positive and negative ESD voltages, at least two distinct ESD protection structures are normally required.

For some applications, as a practical matter, only one dedicated ESD protection structure need be provided for protecting against positive ESD event voltages. Negative ESD event voltages can be clamped at a safe voltage by the inherent body diode present in most circuits (discussed in more detail below).

Referring to FIG. 1, one common device used for an ESD protection structure is a diac 10, which is well known in the art. Between the two electrical terminals 11a (T1), 11b (T2) multiple semiconductor layers 12p, 12n, 14, 16n, 16p. As is well known, the diac 10 is a bi-directional device that becomes conductive when the voltage at one terminal T1 (T2) becomes more positive than the voltage at the other terminal T2 (T1) by an amount greater than the predetermined trigger voltage, and remains conductive, i.e., continues to conduct current from the more positive to the less positive terminal, until such inter-terminal voltage becomes less than a predetermined holding voltage.

Referring to FIG. 2, the implementation of a diac 10a as an ESD protection structure within an IC environment typically appears as shown. The P-type substrate 14, which is typically connected to a circuit reference, or ground, electrode 18, has two N-type wells 12n, 16n diffused or implanted into its surface, separated by a gap region 14g. Within the first well 12n are a similarly diffused or implanted N-type contact region 12na and P-type contact region 12p both of which are connected to one of the diac terminals 11a. Within the second well 16n are another similarly diffused or implanted N-type contact region 16na and P-type contact region 16p, both of which are connected to the other diac terminal 11b. As noted above, this diac structure 10a will provide protection for a positive voltage appearing across the terminals 11a, 11b (one of which is typically connected to the circuit reference electrode 18), but will not provide the primary protection against negative ESD voltages due to the so-called "body diode" which exists by nature of the PN junction between the P-type substrate 14 and the N-type well 12n/16n.

For many circuits or applications, such asymmetrical ESD protection can be acceptable. However, some circuits or systems must be tolerant of negative voltages appearing at the terminals to be protected from ESD events without being clamped at the typically low voltages associated with the body diode. One example of such a circuit would be a circuit used for measuring current in the operation of a circuit or system with a heavy inductive load (e.g., for driving a motor). For proper accuracy, influences created by the chip during operation of the host circuit or system must be minimized, including avoidance of premature voltage clamping caused by voltage spikes which may at first appear, albeit incorrectly, to be an ESD event.

SUMMARY OF THE INVENTION

In accordance with the presently claimed invention, an electrostatic discharge (ESD) protection structure is provided with a diac in which substantially similar ESD protection is provided for both positive and negative ESD voltages appearing at the circuit electrode sought to be protected.

In accordance with one embodiment of the presently claimed invention, an electrostatic discharge (ESD) protection structure with a diac includes one or more reference electrodes, a circuit electrode, a semiconductor material, semiconductor regions and semiconductor wells. The semiconductor material is of a first conductivity type and in electrical communication with one or more of the one or more reference electrodes. A first semiconductor region of the first conductivity type is disposed on the semiconductor material and in electrical communication with at least one of the one or more reference electrodes. A second semiconductor region of a second conductivity type is disposed on the semiconductor material proximate the first semiconductor region and in electrical communication with the at least one of the one or more reference electrodes. A first semiconductor well of the second conductivity type is disposed in the semiconductor material. A second semiconductor well of the first conductivity type is disposed in the first semiconductor well. A third semiconductor region of the first conductivity type is disposed on the second semiconductor well and in electrical communication with the circuit electrode. A fourth semiconductor region of the second conductivity type is disposed on the second semiconductor well and in electrical communication with the circuit electrode.

In accordance with another embodiment of the presently claimed invention, an electrostatic discharge (ESD) protection structure with a diac includes one or more reference electrodes, a circuit electrode, a semiconductor material, semiconductor regions and semiconductor wells. The semiconductor material is of a first conductivity type and in electrical communication with one or more of the one or more reference electrodes. A first semiconductor region of the first conductivity type is disposed on the semiconductor material and in electrical communication with at least one of the one or more reference electrodes. A second semiconductor region of the second conductivity type is disposed on the semiconductor material proximate the first semiconductor region and in electrical communication with the at least one of the one or more reference electrodes. A first semiconductor well of a second conductivity type is disposed in the semiconductor material. A second semiconductor well of the second conductivity type is disposed in the first semiconductor well. A third semiconductor well of the first conductivity type is disposed in the second semiconductor well. A third semiconductor region of the first conductivity type is disposed on the third semiconductor well and in electrical communication with the circuit electrode. A fourth semiconductor region of the second conductivity type is disposed on the third semiconductor well and in electrical communication with the circuit electrode.

In accordance with still another embodiment of the presently claimed invention, an electrostatic discharge (ESD) protection structure with a diac includes one or more reference electrodes, a circuit electrode, a semiconductor material, a semiconductor layer, semiconductor regions and semiconductor wells. The semiconductor material is of a first conductivity type and in electrical communication with one or more of the one or more reference electrodes. A first semiconductor region of the first conductivity type is disposed on the semiconductor material and in electrical communication with at least one of the one or more reference electrodes. A second semiconductor region of the second conductivity type is disposed on the semiconductor material proximate the first semiconductor region and in electrical communication with the at least one of the one or more reference electrodes. The semiconductor layer is of a second conductivity type and disposed in the semiconductor material. A first semiconductor well of the second conductivity type is disposed on the semiconductor layer. A second semiconductor well of the first conductivity type is disposed in the first semiconductor well. A third semiconductor region of the first conductivity type is disposed on the second semiconductor well and in electrical communication with the circuit electrode. A fourth semiconductor region of the second conductivity type is disposed on the second semiconductor well and in electrical communication with the circuit electrode.

DETAILED DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 3A:
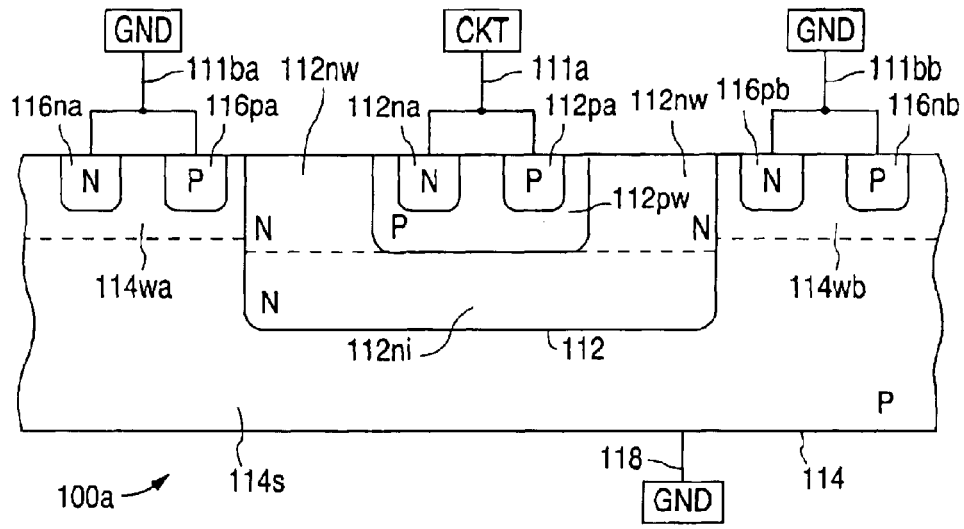
FIG. 3A is a cross-sectional view of an implementation of a diac structure for ESD protection in accordance with one embodiment of the presently claimed invention.

Referring to FIG. 3A, in accordance with one embodiment of the presently claimed invention, an ESD protection structure 100a includes a diac and can be described as follows. (It should be understood that while the following discussion is in terms of specific orders or sequences of P-type and N-type semiconductor materials, substrates, layers, wells, diffusions or implants, such orders or sequences can be reversed, i.e., P-types and N-types can be interchanged, in accordance with well known IC design and fabrication techniques without departing from the spirit and scope of the presently claimed invention. Further, it should also be understood that the semiconductor layers, wells, and regions discussed herein can be implemented using well known diffusion and implantation techniques as appropriate.)

A P-type substrate 114 includes an N-type region 112 which can be implemented as an N-type well, or alternatively as an N-type isolation layer 112*ni* on top of which is an N-type well 112*nw*. (It should be understood that the substrate 114 can include all of the P-type semiconductor material as shown, or alternatively, can be a P-type substrate area 114*s* on top of which the remaining semiconductor layers and regions are deposited or otherwise added.) Within this well 112/112*nw* is a P-type well 112*pw*. In turn, within this well 112*pw* are an N-type contact region 112*na* and a P-type contact region 112*pa*, both of which are connected to a circuit electrode 111*a* for the circuit sought to be protected against ESD events. As a result, two blocking junctions are provided between the circuit electrode 111*a* and the reference electrode 118 to which the substrate 114 is connected: the PN junction between wells 112*pw* and 112/112*nw*; and the PN junction between well 112/112*nw* and substrate 114/114*s*.

The substrate 114/114*s* includes at least one additional set of contact regions, including one or more of: an N-type contact region 116*na* and a P-type contact region 116*pa* connected to a circuit reference electrode 111*ba*; and another N-type contact region 116*nb* and P-type contact region 116*pb* connected to another circuit reference terminal 111*bb*. These N-type contact regions 116*na*, 116*nb* and P-type contact regions 116*pa*, 116*pb* can be distinct contact regions, or alternatively, can form common N-type and P-type semiconductor rings within an annular region about the N-type well 112/112*nw*. Additionally, the reference electrodes 111*ba*, 111*bb* can be separate electrodes or one common electrode connected or available for connection to the reference electrode 118 to which the substrate 114/114*s* is connected. Additionally, these contact regions 116*na*, 116*pa*, 116*nb*, 116*pb* can, in turn, be disposed within respective P-type wells 114*wa*, 114*wb* within the substrate 114/114*s*, with such wells 114*wa*, 114*wb* being either distinct wells or portions of a common annular well (e.g., a latch-up guard ring) about N-type well 112/112*nw*.

Figure 3B:
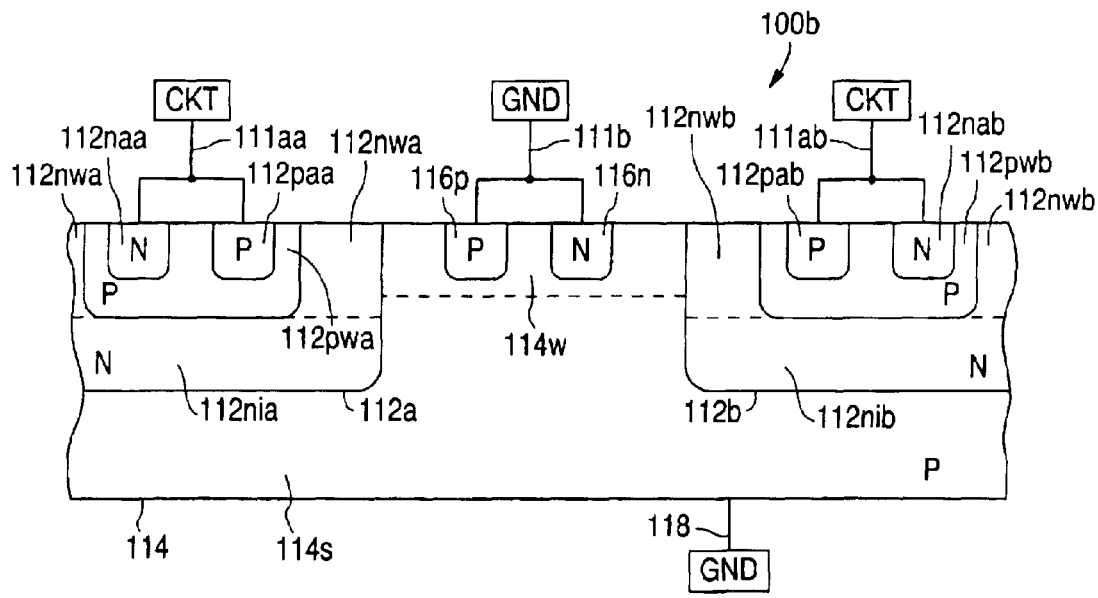
FIG. 3B is a cross-sectional view of an implementation of a diac structure for ESD protection in accordance with another embodiment of the presently claimed invention.

Referring to FIG. 3B, an alternative embodiment 100*b* of an ESD protection structure with a diac in accordance with the presently claimed invention includes a structure similar to that shown in and described in connection with FIG. 3A. In this embodiment 100b, the contact regions 116n, 116p for the reference electrode 111b are disposed between wells 112a/1112nwa, 112pwa, 112b/112nwb, 112pwb and contact regions 112naa, 112paa, 112nab, 112pab for the circuit electrodes 111aa, 111ab. Similar to the embodiment 100a of FIG. 3A, these outer semiconductor wells 112a/112nwa, 112pwa, 112b/112nwb, 112pwb and contact regions 112naa, 112paa, 112nab, 112pab can be separate or portions of an annular region surrounding the contact regions 116n, 116p for the reference electrode 111b.

As is well known in the art, the various semiconductor layers, wells and contact regions discussed above will have various concentrations of dopants introduced to change or otherwise control the charge carrier concentrations. Further, also in accordance with well known semiconductor circuit fabrication techniques, the dopant concentrations of the P-type contact regions 112pa, 116pa, 116pb, 112paa, 112pab, 116p will generally be greater than the dopant concentrations for the P-type wells 112pw, 114wa, 114wb, 112pwa, 112pwb, 114w and substrate 114/114s. Similarly, the dopant concentrations for the N-type contact regions 112na, 116na, 116nb, 112naa, 112nab, 116n will be greater than the dopant concentrations of the N-type wells 112/112nw and isolation layer 112ni.

Operations of these ESD protection structures 100a, 100b during ESD events are in accordance with well-known operating principles for such diac structures and need not be discussed here. (For example, for discussions about general principles of operation of these types of ESD protection structures, including current avalanche breakdown mechanisms and "double injection" of holes and electrons during ESD events, see U.S. Pat. Nos. 6,355,959, 6,433,368 and 6,541,801, the disclosures of which are incorporated herein by reference.)

Figure 1:
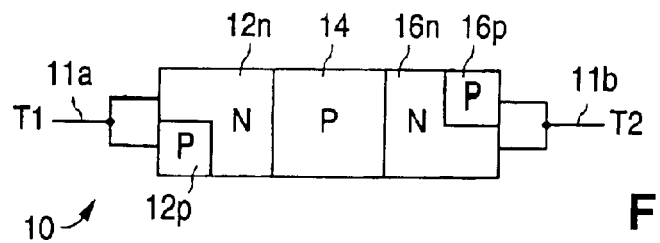
FIG. 1 depicts the structure of a conventional diac.
Figure 2:
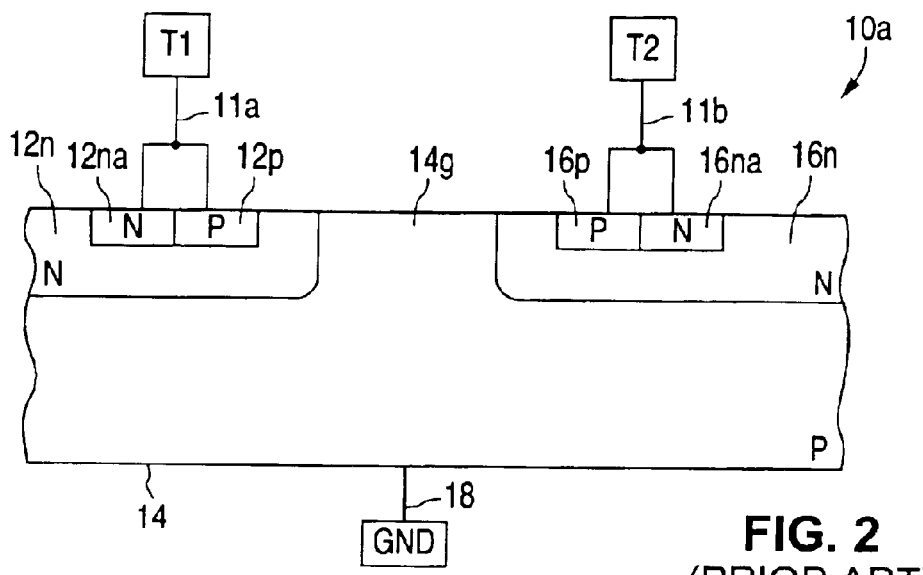
FIG. 2 is a cross-sectional view of a conventional implementation of a diac in an IC.
Figure 4:
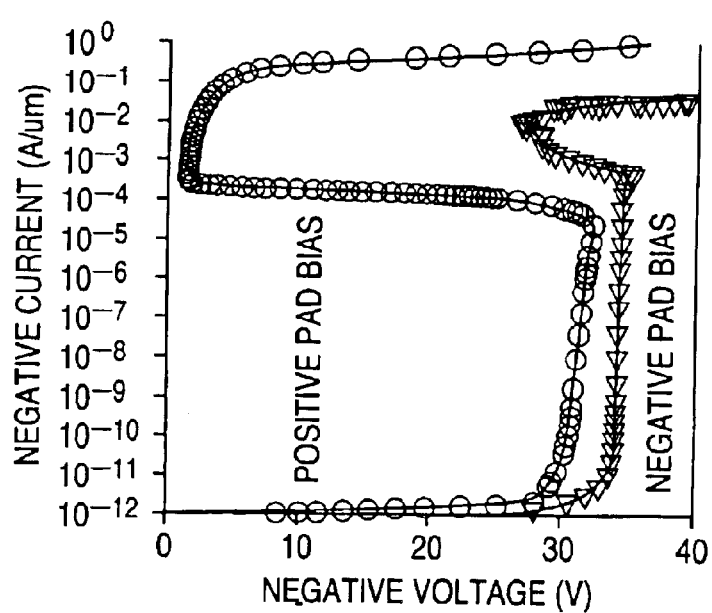
FIG. 4 is a graph of the current-versus-voltage characteristic for one example implementation of a diac structure for ESD protection in accordance with the presently claimed invention.

Referring to FIG. 4, by eliminating the normal body diode effect through the introduction of the dual blocking junctions (discussed above), the ESD protection provided by the above-described ESD protection structures 100a, 100b becomes substantially symmetrical with respect to positive and negative polarity ESD voltages. As can be seen, for both positive and negative voltage biases at the circuit electrodes 111a, 111aa, 111ab, voltage breakdown pursuant to the desired ESD protection occurs at approximately 30 volts in both cases. Accordingly, an ESD protection structure with a diac in accordance with the presently claimed invention provides substantially similar ESD protection for both positive and negative ESD voltages appearing at the circuit electrode sought to be protected.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and equivalents be covered thereby.

What is claimed is:

1. An apparatus including an electrostatic discharge (ESD) protection structure with a diac, comprising:

one or more reference electrodes;

a circuit electrode;

a semiconductor material of a first conductivity type in electrical communication with one or more of said one or more reference electrodes;

a first semiconductor region of said first conductivity type disposed on said semiconductor material and in electrical communication with at least one of said one or more reference electrodes;

a second semiconductor region of a second conductivity type disposed on said semiconductor material proximate said first semiconductor region and in electrical communication with said at least one of said one or more reference electrodes;

a first semiconductor well of said second conductivity type disposed in said semiconductor material;

a second semiconductor well of said second conductivity type disposed in said first semiconductor well;

a third semiconductor well of said first conductivity type disposed in said second semiconductor well;

a third semiconductor region of said first conductivity type disposed on said third semiconductor well and in electrical communication with said circuit electrode; and a fourth semiconductor region of said second conductivity type disposed on said third semiconductor well and in electrical communication with said circuit electrode.

2. The apparatus of claim 1, wherein:

said first conductivity type comprises P-type; and said second conductivity type comprises N-type.

3. The apparatus of claim 1, wherein:

each of said semiconductor material, said third semiconductor well, and said first and third semiconductor regions has a respective dopant concentration; and said first and third semiconductor region dopant concentrations are greater than said semiconductor material and third semiconductor well dopant concentrations, respectively.

4. The apparatus of claim 1, wherein said semiconductor material comprises a substrate for an integrated circuit.

5. The apparatus of claim 1, further comprising a substrate for an integrated circuit, wherein said semiconductor material is disposed on said integrated circuit substrate.

6. The apparatus of claim 1, wherein said circuit electrode comprises a signal interface for said integrated circuit.

* * * * *